FREQUENCY STANDARD SIGNAL GENERATOR

Filed April 2, 1957

INVENTOR.
SAMUEL K. LACKOFF
BY Theodore Hafner
ATTORNEY

United States Patent Office 3,046,491

Patented July 24, 1962

3,046,491
FREQUENCY STANDARD SIGNAL GENERATOR

Samuel K. Lackoff, Manchester, N.H., assignor to Van Norman Industries, Inc.

Filed Apr. 2, 1957, Ser. No. 650,237
2 Claims. (Cl. 331—52)

This invention relates to signal generators for producing frequency standards to be compared with unknown frequencies or to be used in connection with other measurements.

One of the objects of the invention is a signal generator of the portable type producing frequency signals over a wide range of frequencies, preferably up to 200 megacycles and more, with a high degree of accuracy of say 1/100 of 1 percent and higher, especially when used in combination with temperature controlled crystal devices.

Another object of the invention is to operate a transistor device at base saturation to obtain a clipping of a sinusoidal wave to produce a wave form with rather steep wave front and a high harmonic content.

A more specific object of the invention is to produce a wave shape of approximately sinusoidal form during one half cycle and of a severely clipped wave shape in the other half of the cycle.

A further object of the invention is to provide in the emitter circuit of a transistor device, a crystal device tuned to a predetermined frequency and at the same time to provide a transistor device in its collector circuit width a tuning circuit rather broadly tuned to a frequency or frequency range substantially different or deviating from the frequency of the crystal device.

Still another object of the invention is to connect in alternating operable relationship a pair of transistor devices, preferably over a pair of coupling capacities the junction point of which is connected to an output terminal; at least one of these transistor devices have a base circuit operated at or near saturation.

In this feature of the invention, the base circuits are insulated from the output terminals, especially in the case when the output load is of low impedance or low direct current resistance characteristic, as the case may be.

Still another object of the invention is to provide, in parallel with at least one of these transistor circuits, another transistor circuit in the form of a blocking oscillator in which a half cycle is blocked off so as to result in rather narrow triangular type wave shapes, of say less than two micro seconds duration, which serve to superimpose a marker frequency pip upon the pips produced by the other transistor devices. This marker frequency is of a smaller order of pulse repetition frequency than the other frequency; such frequency is then superimposed upon the frequency of the first and second transistor circuits.

Such marker frequency, if desired, may be triggered in otherwise well known manner by the frequency of the lower frequency transistor current, or that circuit which produces an intermediate frequency standard.

Still further an object in the invention is to provide a lower frequency modulating circuit, also of the transistor type, connected in series with a low voltage battery feeding the collector of the transistor and thereby modulating selectively the collector either of the high frequency or intermediate frequency transistor circuits (such as 1 megacycle and 100 kilocycles respectively). This will facilitate in otherwise well known manner tuning of receiver equipment connected to the common output circuit of two higher frequency transistor circuits.

The frequency signal standard generator can thus be used in several ways, such as to measure an unknown frequency by beating this unknown frequency with the frequency standard and observing the results on an oscillograph or oscilloscope, or alternatively by mixing in the same manner as mentioned before but attaching the mixer output to a receiver (which may include in addition to the above mentioned mixing circuit, a local oscillator of known frequency) producing the unknown frequency by such receiver.

These and other objects of the invention will be more fully described in the annexed drawings in which.

Figure 1:
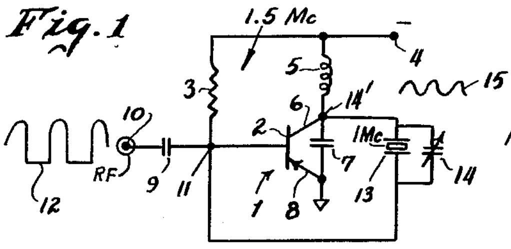
FIG. 1 represents a single transistor circuit embodying certain principles of the invention.

In FIG. 1 part 1 represents a transistor of the p-n-p type such as 2N34, the base electrode 2 of which is connecter over biase resistance 3 to one terminal 4 of a low potential power supply, and also connected over tuning inductance 5 to collector electrode 6, and over tuning capacity 7 and emitter electrode 8 to ground or another terminal of the low potential power supply the tuning frequency of 3, 5 is at 1.5 megacycles.

Base electrode 2 is also connected over a blocking capacity 9 to a radio frequency output terminal 10.

In accordance with the invention the circuit and especially base electrode 2 is operated in such a manner, i.e., at or near saturation, that at junction point 11 there will be produced a relatively strong positive voltage of the shape approximately indicated at 12 of say plus 5 volts, provided the voltage at point 4 is minus 12 volts.

Point 11 is further connected over crystal device 13 of 1 mc. to the collector electrode 6, and in turn is shunted by tuning capacity 14, which, by loading up or down crystal device 13, is capable of changing the crystal frequency to a predetermined extent and within predetermined limits.

Wave shape 12 has been found rather rich in large amplitude harmonics. For example, as has been found from measurements underlying the invention wave shape 12 had a 30 megacycle harmonic which was 10 db above 50 microvolts. A 54 megacycle harmonic has been found to be 10 db above 44 microvolts, all measured across a 30 ohm impedance.

At junction point 14 the oscillations have the approximately sinusoidal shape indicated at 15.

Figure 2:
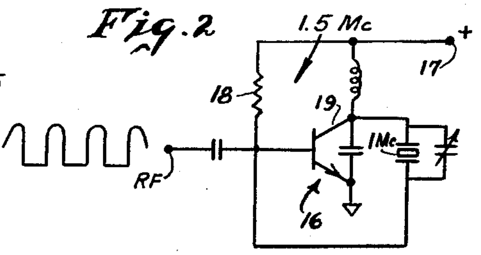
FIG. 2 represents another transistor circuit also embodying certain principles.

In FIG. 2, a transistor type oscillator 16 is shown producing a similar frequency standard as that produced above, say 1 megacycle, and having substantially the same operating characteristics as the circuit of FIG. 1.

However, in the case of FIG. 2 the transistor is of the n-p-n type (i.e. 2N35) and the power supply potential applied at terminal 17 and over bias resistance 18 to base electrode 19 is positive instead of negative as applied in the circuit of FIG. 1 at terminal 4.

Otherwise the saturation characteristics of the base electrode and the broad band characteristics of the tuning circuit of transistor device 16 are substantially the same as in FIG. 1, base electrode 19 being operated to produce an at least partly chopped up wave shape such as shown in FIG. 1 at 12, and which is rich in harmonics.

In a specific case of the circuit of FIG. 2 a 30 megacycle harmonic has been measured at 10 db above 50 microvolts. A 54 megacycle harmonic has been found at 44 microvolts.

It is also noted, in accordance with the invention, that the tuning circuits of the transistor oscillators, i.e. tuning choke 5 and tuning capacity 7, are broadly tuned and tuned to a frequency substantially outside of the frequency of the crystal device. In the particular case of the circuit of FIG. 2, the tuning frequency was found substantially below the crystal frequency as more clearly illustrated in FIG. 3 in which the repetition frequency of the output of the oscillators is shown as the function of the reactance $L_1C_1$ of the tuning circuits.

Figures 3, 4:
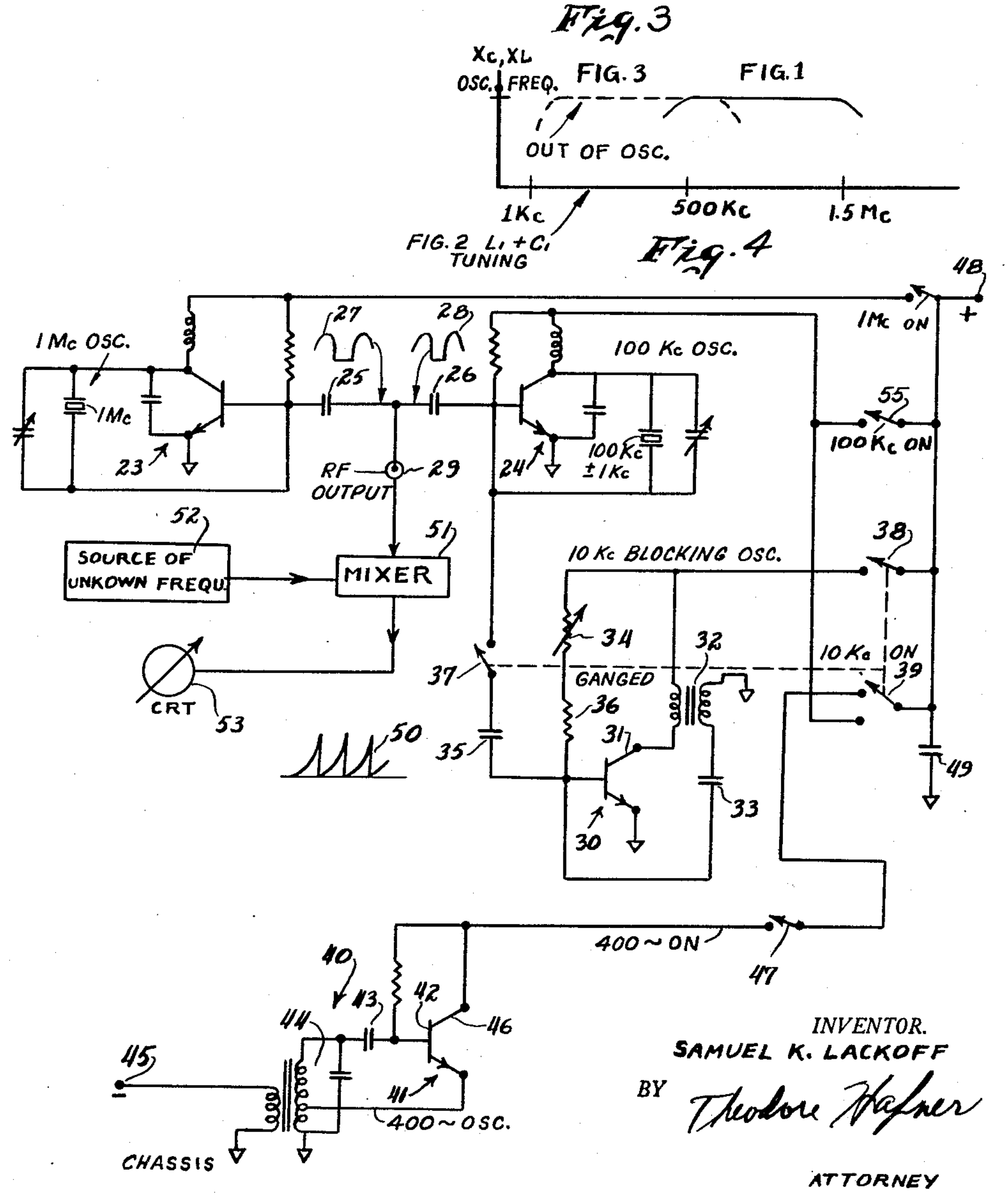
FIG. 3 represents operating characteristics for the circuits of FIG. 1.
FIG. 4 represents diagrammatically a combination of transistor circuits forming a frequency standard signal generator in accordance with the invention.

It is apparent from FIG. 3 that in order to maintain oscillations, this reactance must remain between rather broad frequency limits.

The radio frequency output wave of a circuit according to FIGURE 2 is also very rich in harmonics. In a particular case a 100 kilocycle oscillator was operating selectively alone or together with either a 1 megacycle oscillator such as shown in FIGS. 1 or 2, or a 10 kilocycle blocking oscillator of the type illustrated and described further below with respect to FIG. 4.

In the case of the 100-kilocycle oscillator operating alone, a 30 megacycle harmonic was found at 16 microvolts, and in the case of a 100 kilocycle oscillator cooperating with a 1 megacycle oscillator, a 30.1 megacycle harmonic was found at 44 microvolts, while the 100-kilocycle oscillator operating with a 10 kilocycle oscillator showed a 15 megacycle harmonic of 44 microvolts.

With a receiver of a sensitivity of 5 microvolts with 30 db squelching, a 100 kilocycle oscillator alone had a harmonic content extending to 100.1 megacycles while a 100-kilocycle oscillator cooperating with a 1 megacycle oscillator had harmonics extending to 108 megacycles and higher (up to 200 megacycles).

On the other hand, with the 1-megacycle oscillator operating alone, the harmonic content has been found to extend to 118 megacycles and very much over.

FIGURE 4 shows two transistor circuits of the type shown in FIG. 1 or 2, respectively, interconnected to form a frequency standard signal generator of broadband output. In this case, a transistor circuit of the type shown in FIG. 1 and indicated in FIG. 4 at 23 is coupled in series aiding relationship with another transistor circuit shown at 24 and of the type schematically indicated in FIG. 2.

Transistor circuits 23 and 24 are intercoupled with their base electrodes over coupling capacities 25 and 26 producing at their junction point wave shapes 27 and 28 alternatively under control of switches 54, 55. This junction point is connected to output terminal 29.

Coupling capacities 25 and 26 serve to insulate the base electrodes of transistor circuits 23 and 24 from direct current and radio frequency output.

Another oscillator circuit 30 of the blocking type and generally rather well known construction, is connected to superimpose 10 kilocycle frequency signals upon the 1 megacycle and 100 kilocycle frequency signals produced by oscillators 24 and 23. Blocking oscillator 30 is shown in FIG. 4 as having a collector electrode 31 brought to oscillation over a transformer 32 and a capacity 33, insulating the direct current from transformer 22.

Tuning resistance 34 serves to vary the collector current thereby varying the repetition frequency of blocking oscillator 30; condensor 35 serves to insulate the base of transistor circuit 30 from the base of the 100 kilocycle transistor oscillator 23.

Resistance 34 also represents a bias resistance in series with regulating resistance 36.

Switches 37, 38 and 39 are ganged and serve to switch-in the base voltage of the 100-kilocycle oscillator 24 to trigger blocking oscillator 30.

More specifically, switch 37 applies to, and switch 38 disconnects, the collector voltage from a 400 cycle oscillator circuit schematically indicated in FIG. 4 at 40, in case, if such oscillator 40 is desired, and oscillator 30 is in "on" position.

Conversely if 400 cycle oscillator 40 accidentally were in operation when switches 37, 38 and 39 are closed, it could not be capable of offsetting the three oscillator circuits 23, 24 and 30 if these circuits were all desired to operate and generate appropriately shaped pulses of predetermined repetition frequency.

On the other hand, 400 cycle oscillator 40 will only operate when 10 kilocycle oscillator 30 is disengaged.

400 cycle oscillator 40 is of more or less standard type with a transistor 41 of the 2N35 type having a base electrode 42 connected over a capacity 43 to a transformer coupled tuning circuit 44, the secondary of which is connected to the negative terminal 45 of a low voltage power supply. On the other hand, collector electrode 46 of transistor 41 is coupled over switch 47 and switch 39 to the positive terminal 48 of the power supply of the frequency signal standard generator. It is well known in the art that due to the impedance of this power supply, a voltage from oscillator 40 will develop thereacross to effect a variation which will produce modulation.

In this way the oscillations of the 400 cycle oscillator circuit 40 are coupled, depending upon the position of the switch marked "100 kc. on" over the low impedance of power supply 45 and 48 to the collector electrodes of one or the other of the 1-megacycle and 100-kilocycle oscillators 23 and 24. They are, however, automatically uncoupled as soon as the oscillations from the 10 kilocycle oscillator 30 are to be added to the oscillations of the 1-megacycle and 100-kilocycle oscillators 23 and 24, respectively.

Capacity 49 represents a radio frequency filter capable of stopping radio frequency oscillations entering the low frequency modulating circuit but permitting on the other hand the 400 cycle frequency of oscillator 40 to enter the frequency standard oscillations circuits if desired.

The wave shape of the 10 kilocycle oscillator is indicated at 50.

One example of utilizing the frequency standard signal generator of the type shown in FIG. 4 is in feeding the radio frequency output from output terminal 29 into a mixer schematically indicated at 51, another input terminal of which has applied thereto the unknown frequency of a signal source schematically indicated at 52. The mixer output is applied to a cathode ray oscillograph or oscilloscope schematically indicated at 53.

The invention is, of course, not limited to the circuit elements, circuit connections and circuit combinations illustrated and described but may be applied in any appropriate form, shape or manner whatsoever without departing from the scope of this disclosure.

I claim:

1. In a frequency signal standard generator, at least two transistor devices each having base, collector and emitter electrodes, a common power supply therefor, crystal devices connected between the collector and base electrodes of each of said transistor devices to operate at substantially different predetermined frequencies, tuning inductances coupling the collector electrode to the base electrode of each of said crystal devices and also coupled to one terminal of said power supply; tuning capacities connected between the collector and emitter electrodes of each of said crystal devices to vary the crystal frequency within relatively narrow limits; the latter electrodes being also connected to another terminal of said power supply, each of said tuning inductances together with the capacitances connected thereto being relatively broadly tuned to frequency ranges substantially outside of the frequency of the transistor device coupled thereto, means including resistances and switching means selectively connecting the base electrode of each crystal device with said first terminal to bias said base electrode to a point near saturation, a common output circuit capacitively coupled to each of said base electrodes and a further transistor device in the form of a blocking oscillator operative at a frequency substantially below the frequencies of said other transistor devices, and switching means for capacitively coupling the base electrode of said further transistor device to the base electrodes of at least one of said other transistor devices, so as to be triggered by said transistor devices.

2. A circuit according to claim 1 wherein said blocking oscillator is triggered by the lower frequency of the two transistor devices so as to produce a frequency division, and means for selectively superimposing the divided frequency oscillation upon at least one of the two other frequency oscillations.

References Cited in the file of this patent

UNITED STATES PATENTS

| | | |
|---|---|---|
| 2,469,811 | Bradley et al. | May 10, 1949 |
| 2,745,009 | Jean-Marie Moulon | May 8, 1956 |
| 2,755,384 | Pierson et al. | July 17, 1956 |
| 2,777,064 | Robinson | Jan. 8, 1957 |
| 2,887,573 | Hurska | May 19, 1959 |
| 2,894,208 | Crow | July 7, 1959 |

OTHER REFERENCES

"Transistor Pulse Generators," by Eckess et al., pages 132–33 of Electronics for November 1955.

"Single Transistor Frequency Standard," pages 46–47 of Electronics Design for July 1955.